United States Patent [19]
Kohno

[11] Patent Number: 5,615,676
[45] Date of Patent: Apr. 1, 1997

[54] MR IMAGING METHOD AND APPARATUS UTILIZING GRADIENT AND SPIN ECHO TECHNIQUE

[75] Inventor: Satoru Kohno, Kyoto, Japan

[73] Assignee: Shimadzu Corporation, Kyoto, Japan

[21] Appl. No.: 412,567

[22] Filed: Mar. 29, 1995

[30] Foreign Application Priority Data

May 31, 1994 [JP] Japan .................................. 6-142551

[51] Int. Cl.$^6$ .................................................. A61B 5/055
[52] U.S. Cl. ..................... 128/653.2; 324/307; 324/309
[58] Field of Search ...................... 128/653.2; 324/307, 324/309

[56] References Cited

U.S. PATENT DOCUMENTS

| | | | |
|---|---|---|---|
| 4,709,212 | 11/1987 | MacFall et al. | 324/309 |
| 4,896,113 | 1/1990 | Pelc . | |
| 4,901,020 | 2/1990 | Ladenbeck et al. | 324/309 |
| 5,270,654 | 12/1993 | Feinberg et al. . | |

FOREIGN PATENT DOCUMENTS

| | | |
|---|---|---|
| 318212A2 | 5/1989 | European Pat. Off. . |
| 571212A1 | 11/1993 | European Pat. Off. . |
| 644437A1 | 3/1995 | European Pat. Off. . |

OTHER PUBLICATIONS

"GRASE (Gradient–and Spin–Echo) Imaging: A Novel Fast MRI Technique," Oshio et al., Magnetic Resonance in Medicine 20, pp. 344–349 (1991).
"Chemical–Shift Imaging with Large Magnetic Field Inhomogeneity," Kim et al., Magnetic Resonance in Medicine 4, pp. 452–460 (1987).
"Gradient–Echo Shifting in Fast MRI Techniques (GRASE Imaging) for Correction of Field Inhomogeneity Errors and Chemical Shift," David A. Feinberg et al., Journal of Magnetic Resonance, vol. 97, No. 1, Mar. 1, 1992, Orland, MN, pp. 177–183.
"Single–Shot GRASE Imaging without Fast Gradients," Koichi Oshio et al., Magnetic Resonance in Medicine, vol. 26, No. 2, Aug. 1, 1992, Duluth, MN, pp. 355–360.
"Dual Contrast GRASE (Gradient–Spin Echo) Imaging Using Mixed Bandwith," David A. Feinberg et al., Magnetic Resonance in Medicine, vol. 31, No. 4, Apr. 1, 1994, Duluth, MN, pp. 461–464.

Primary Examiner—Marvin M. Lateef
Assistant Examiner—Brian L. Casler
Attorney, Agent, or Firm—Nikaido, Marmelstein, Murray & Oram LLP

[57] ABSTRACT

An MR imaging method uses NMR phenomenon, and includes a number of steps. These steps include emitting an excitation RF pulse and a plurality of refocus RF pulses to an object to generate a plurality of spin echo signals successively, and applying slice selecting gradient field pulses simultaneously with the RF pulses, respectively, for selecting slice planes. A polarity of reading gradient field pulses is switched a plurality of times to generate a plurality of gradient echo signals. A phase-encoding gradient field pulse, providing a different integrated phase encode amount, is applied to each of a plurality of echo signals generated after each of the spin echo signals is generated. The reading gradient field pulses are applied in timed relationship with generation of the spin echo signals. A pulse sequence consisting of the above steps is repeated while varying the integrated phase encode amount. Data acquired from the same group of echo signals is processed to arrange the data in one of different k spaces to reconstruct a plurality of slice images based on the k spaces, respectively.

8 Claims, 5 Drawing Sheets

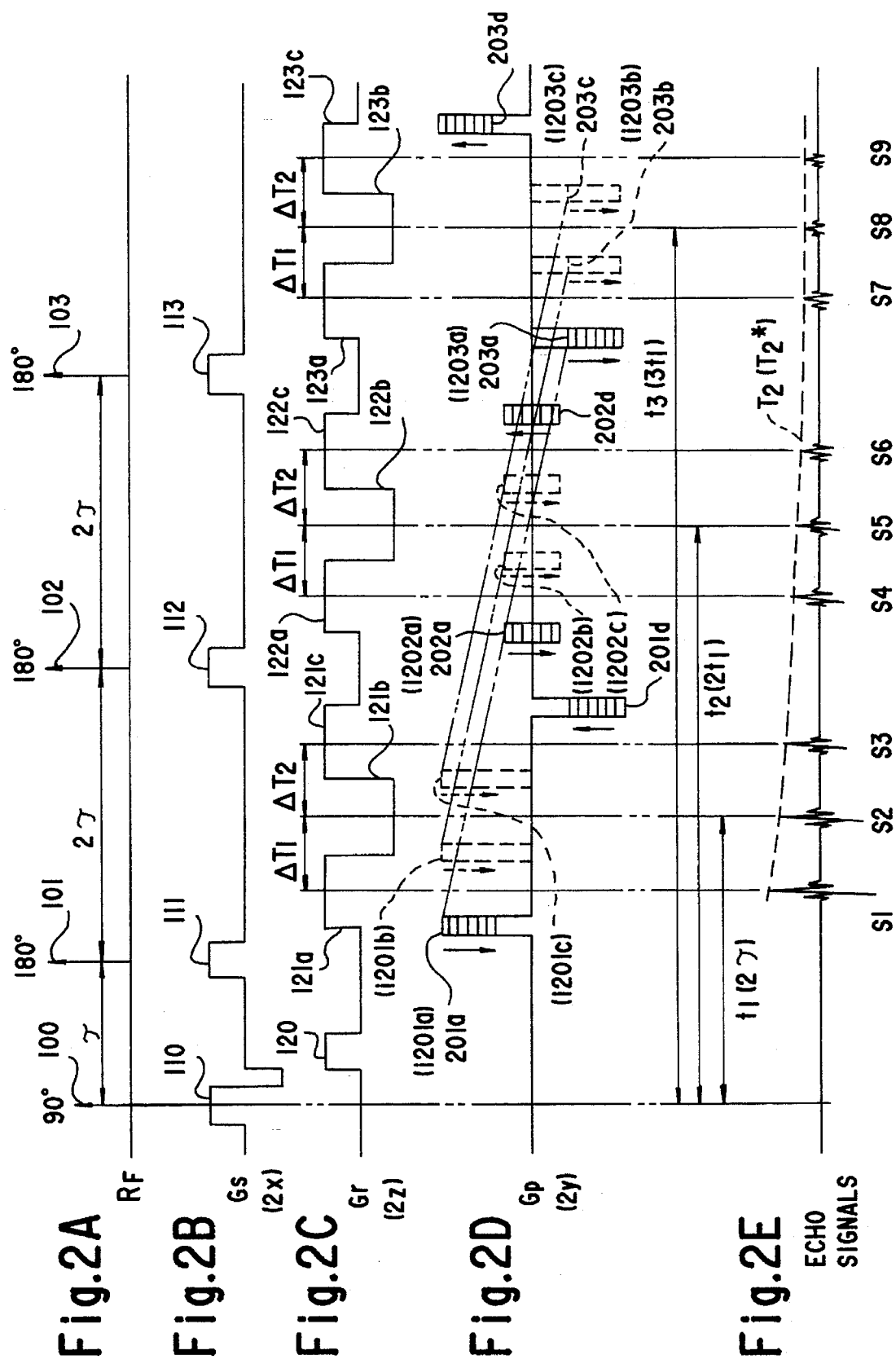

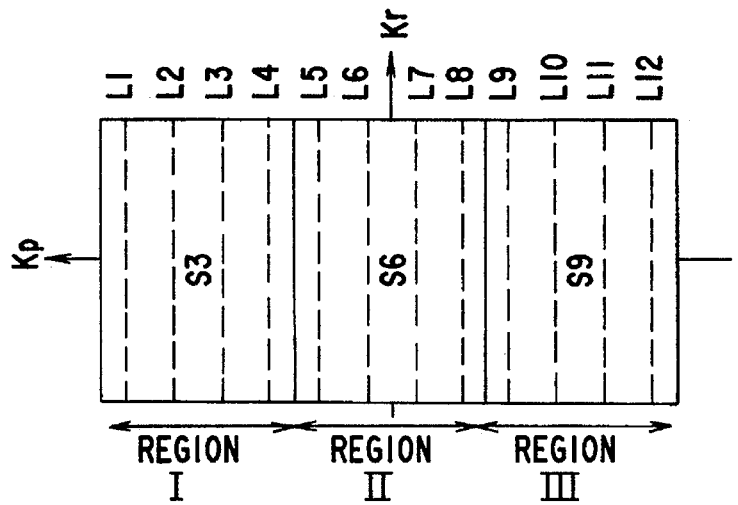
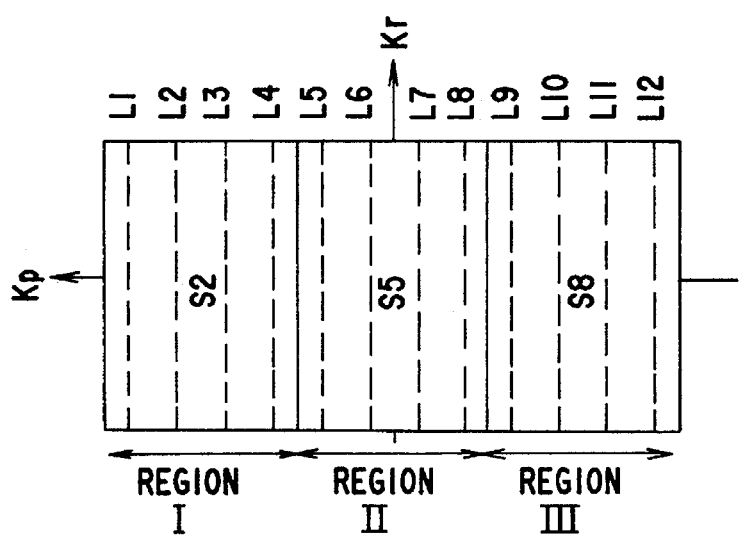
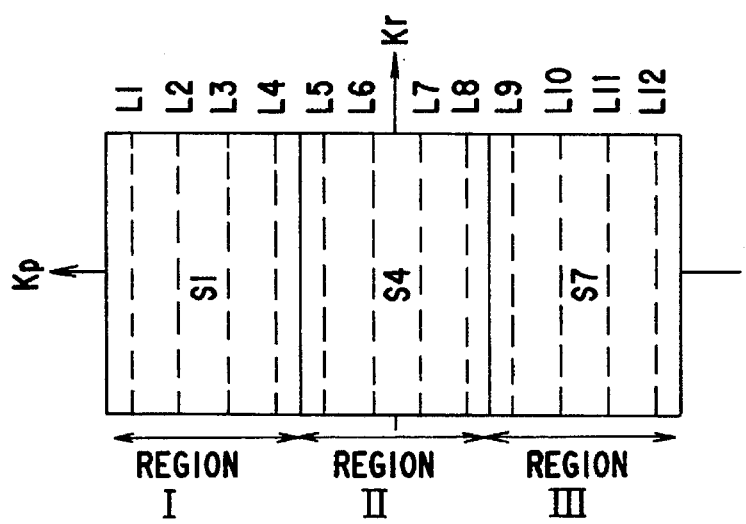

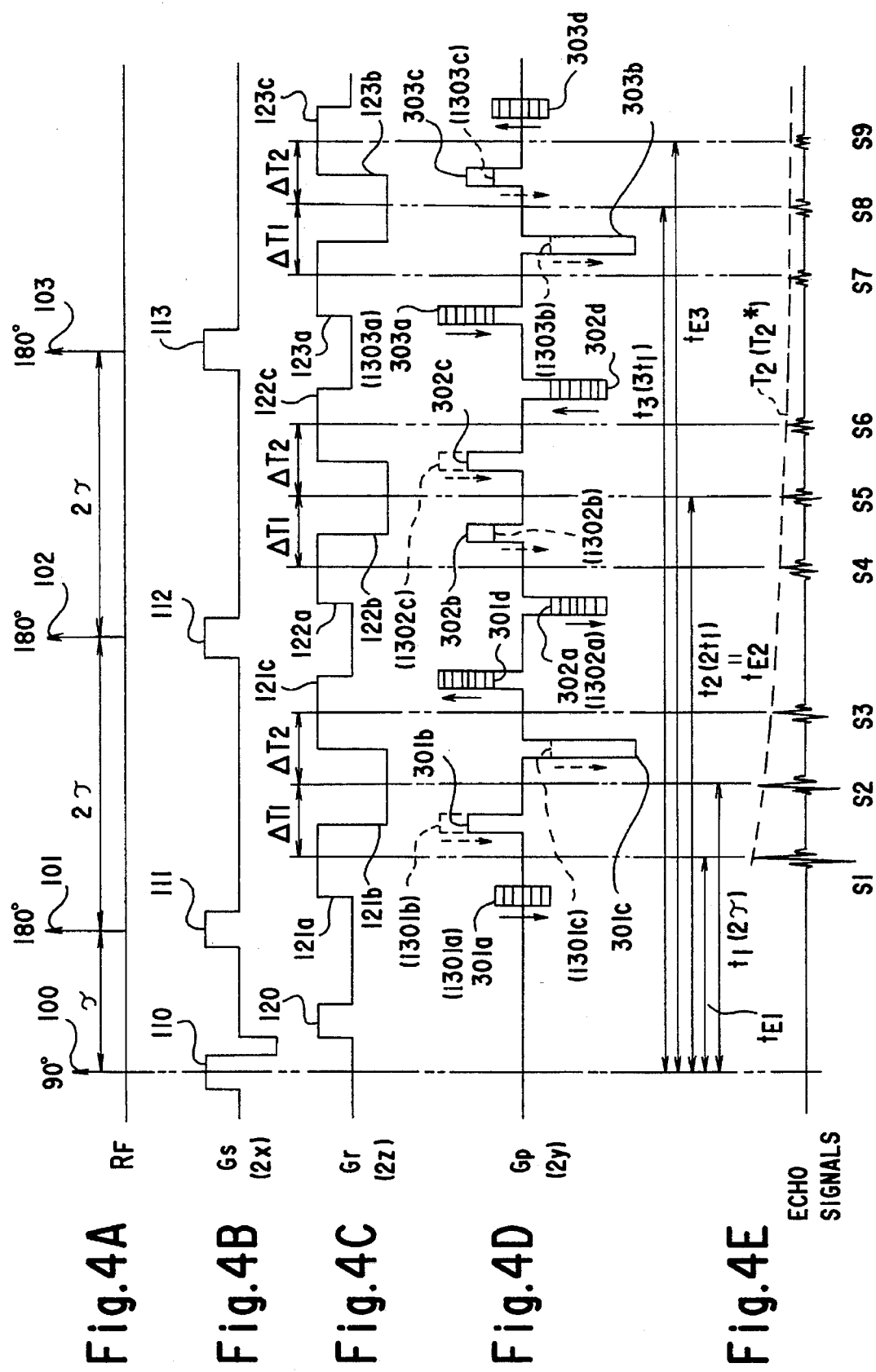

MR IMAGING METHOD AND APPARATUS UTILIZING GRADIENT AND SPIN ECHO TECHNIQUE

BACKGROUND OF THE INVENTION (1) Field of the Invention

This invention relates to MR imaging methods and apparatus using NMR (nuclear magnetic resonance) phenomenon, and more particularly to an MR imaging method and apparatus for effecting high-speed imaging based on GRASE (gradient and spin echo) technique.

(2) Description of the Related Art

An MR imaging apparatus is known which effects a pulse sequence for high-speed imaging called GRASE technique (U.S. Pat. No. 5,270,654, and K. Oshio and D. A. Feiberg "GRASE (Gradient and Spin Echo) Imaging: A Novel Fast MRI Technique", Magnetic Resonance in Medicine 20, 344–349, 1991). The pulse sequence based on the GRASE technique is one combining the EPI (Echo Planar Imaging) technique which generates gradient echo signals by switching the polarity of a gradient magnetic field, and the RARE (Rapid Acquisition with Relaxation Enhancement) which generates spin echo signals by using an excitation RF (Radio Frequency) pulse (also called 90° pulse since it rotates the spin phase of protons 90°) and refocus RF pulses (also called 180° pulses since they rotate the spin phase of protons 180°).

In this method, a group of data acquired from a plurality of echo signals generated are arranged in the same k space (also called a raw data space), and an image is reconstructed by a two-dimensional Fourier transform of this k space. This method can provide a T2-enhanced image at high speed by generating a plurality of echo signals (there being two types; gradient echo signals and spin echo signals) within a period of one pulse sequence (i.e. repetition time) to reduce the number of cycles within the repetition time. The "T2" in the T2-enhanced image refers to a transverse relaxation time (also called spin-spin relaxation time). The T2-enhanced image is one emphasizing water in the body of an examinee.

The conventional GRASE technique noted above indeed enables high-speed imaging. However, since a group of data acquired from a plurality of echo signals (each including different information) are arranged in a single k space, a T2-enhanced image can be reconstructed from the k space only with one contrast.

SUMMARY OF THE INVENTION

The object of this invention is to provide an MR imaging method and apparatus based on an improved GRASE technique, which is capable of producing a plurality of images having, as a parameter, a degree of signal attenuation resulting from a field non-uniformity due to a difference in magnetization rate; producing water/fat separation images at high speed; and simultaneously producing multi-contrast images such as a proton-density image, a T2-enhanced image and a heavy T2-enhanced image.

The above object is fulfilled, according to this invention, by an MR imaging method using NMR phenomenon, comprising the steps of:

(a) emitting an excitation RF pulse and thereafter a plurality of refocus RF pulses to an object to generate a plurality of spin echo signals successively;

(b) applying slice selecting gradient field pulses simultaneously with the excitation RF pulse and the refocus RF pulses, respectively, for selecting slice planes;

(c) switching polarity of reading gradient field pulses a plurality of times, during each of periods between the refocus RF pulses, to generate a plurality of gradient echo signals distributed across one of the spin echo signals;

(d) applying, during each of the periods between the refocus RF pulses, a phase-encoding gradient field pulse providing a different integrated phase encode amount, to each of a plurality of echo signals (hereinafter called the same group of echo signals) generated upon lapse of the same time period from a point of time at which each of the spin echo signals is generated;

(e) applying the reading gradient field pulses in timed relationship with generation of the echo signals;

(f) repeating a pulse sequence of steps (a) through (e) above while varying the integrated phase encode amount at step (d) above; and (g) processing data acquired from the same group of echo signals to arrange the data in one of different k spaces according to the integrated phase encode amount applied to each of the echo signals, and to reconstruct a plurality of slice images based on the k spaces, respectively.

One excitation RF pulse and thereafter a plurality of refocus RF pulses are successively emitted to an object (step (a)), and slice planes are selected by applying slice selecting gradient field pulses simultaneously with the RF pulses (step (b)). Further, a plurality of gradient echo signals distributed across one of the spin echo signals are generated by switching polarity of reading gradient field pulses a plurality of times during each of periods between the plurality of refocus RF pulses (step (c)). Thus, this method is the same as the conventional GRASE technique in obtaining a plurality of echo signals within one repetition time.

Next, phase encoding is carried out for the plurality of echo signals generated (step (d)). This is effected by applying, during each of the periods between the refocus RF pulses, a phase-encoding gradient field pulse providing a different integrated phase encode amount, to each of a plurality of echo signals (called herein the same group of echo signals) generated upon lapse of the same time period from a point of time at which each of the spin echo signals is generated. That is, the phase encoding is effected to provide different integrated phase encode amounts for the echo signals in the same group. Similarly, the phase encoding is effected to provide different integrated phase encode amounts for the echo signals in each of the other groups.

Assume, for example, that one excitation RF pulse and then three refocus RF pulses are emitted, and polarity of the reading gradient field pulses is switched twice during each period between the refocus RF pulses. This generates one spin echo signal, and one each gradient echo signal before and after the spin echo signal, during each period between the refocus RF pulses, thus generating a total of nine echo signals (with three echo signals generated during each period). These echo signals are divided into a group of three gradient echo signals generated before the respective spin echo signals, a group of three spin echo signals, and a group of three gradient echo signals generated after the respective spin echo signals. The phase encoding is effected to provide different integrated phase encode amounts for the echo signals in each group.

Next, the reading gradient field pulses are applied in timed relationship with generation of the spin echo signals (step (e)). The above pulse sequence is repeated while varying the integrated phase encode amount.

After repeating the above pulse sequence, data acquired from the same group of echo signals are arranged in one of different k spaces according to the integrated phase encode amount applied to each of the echo signals, and a plurality of slice images are reconstructed based on the k spaces, respectively (step (g)). Thus, a plurality of echo signals generated through a series of pulse sequences are divided into groups corresponding in number to the echo signals generated during each period between the refocus RF pulses. The data derived from each group (of echo signals) are arranged in a different k space. Then, the data processing step is executed to reconstruct a plurality of slice images based on the respective k space.

There are two types of echo signals generated; spin echo signals and gradient echo signals. Each type of echo signal includes different information. The gradient echo signals generated before and after the spin echo signals also include different types of information. With a tumor due to an iron deposit such as a hematoma, for example, the iron disturbs the magnetic field to cause considerable variations in magnetization rate. Such variations in magnetization rate are not reflected in the spin echo signals invulnerable to non-uniformity of the magnetic field, but are prominently reflected in the gradient echo signals. In addition, the gradient echo signals show a sharp drop in signal strength with the variations in magnetization ratio which increase progressively with delay from the points of time where spin echo conditions are established (i.e. where the spin echo signals are generated by emission of the excitation RF pulse and refocus RF pulses). Consequently, the gradient echo signals generated before and after the spin echo signals include different information.

A plurality of images may be reconstructed from a plurality of k spaces. These k spaces include the k space formed of the data acquired from the spin echo signals, the k space formed of the data acquired from the gradient echo signals generated before the spin echo signals, and the k space formed of the data acquired from the gradient echo signals generated before the spin echo signals. These images are an image free from signal attenuation, and (at least two) images with signal attenuation. That is, the method according to the present invention simultaneously provides a plurality of images having different contrasts, with degrees of signal attenuation serving as a parameter.

In the method according to the present invention, it is preferred that, at step (a) above, emission timing of an "n"th refocus RF pulse ("n" being a positive integer) is set to establish;

$$\{2(n-1)+1\}\tau$$

where emission of the excitation RF pulse is regarded as time origin, and $\tau$ is a point of time at which a first one of the refocus RF pulses is emitted.

Where the refocus RF pulses are emitted with the above timing, the periods of time to generation of the respective spin echo signals correspond to the period of time to generation of the first spin echo signal multiplied by integers. Thus, spurious echo signals due to imperfection of the refocus RF pulses are generated at the same points of time as the primary echo signals to suppress phase shift. In this way, the spurious echo signals may also be used as stimulated spin echo signals for image formation.

In a further aspect of the invention, an MR imaging apparatus using NMR phenomenon, comprises:
 a main magnet for generating a uniform static magnetic field in an imaging space;
 a first, a second and a third gradient field coils attached to the main magnet for generating three types of gradient field pulses (i.e. slice-selecting gradient field pulses, reading gradient field pulses and phase-encoding gradient field pulses) with magnetic strengths varying in three orthogonal directions in the imaging space;
 a RF coil for emitting an excitation RF pulse and a plurality of refocus RF pulses to an object placed in the imaging space, and detecting echo signals generated from the object;
 a RF emitter for successively emitting the excitation RF pulse and the refocus RF pulses with predetermined timing through the RF coil;
 a slice-selecting gradient field pulse generator for generating the slice-selecting gradient field pulses through the first gradient field coil for selecting slice planes, in timed relationship with the excitation RF pulse and the refocus RF pulses;
 a reading gradient field pulse generator for switching polarity a plurality of times to generate a plurality of gradient echo signals distributed across one of spin echo signals, and generating the reading gradient field pulses through the second gradient field coil in timed relationship with the spin echo signals and the gradient echo signals, during each of periods between the refocus RF pulses;
 a phase-encoding gradient field pulse generator for varying, during each of the periods between the refocus RF pulses, strength of the phase-encoding gradient field pulses for application to each of a plurality of echo signals (hereinafter called the same group of echo signals) generated upon lapse of the same time period from a point of time at which each of the spin echo signals is generated, to vary integrated phase encode amounts of the echo signals from a positive (or negative) value through zero to a negative (or positive) value according to an order of generation of the echo signals, for generating the phase-encoding gradient field pulses through the third gradient field coil immediately before generation of the echo signals to form a pulse sequence, and for repeating the pulse sequence while varying the integrated phase encode amounts; and
 a data processor for arranging data acquired from the same group of echo signals in one of different k spaces according to the integrated phase encode amount applied to each of the echo signals, and for reconstructing a plurality of slice images based on the k spaces, respectively.

The main magnet forms a static magnetic field in an imaging space, and then the first gradient field coil applies a slice-selecting gradient field pulse to the imaging space to select a slice. Then, the RF emitter successively emits one excitation RF pulse and a plurality of refocus RF pulses successively. Spin echo signals free from phase errors or signal attenuation due to non-uniformity of the static magnetic field formed by the main magnet, due to an iron deposit such as a hematoma or due to chemical shifts are generated during a period between the excitation RF pulse and the first refocus RF pulse and during periods corresponding to the above period multiplied by even numbers. Further, during each of the periods between the refocus RF pulses, the reading gradient field pulse generator switches the polarity of reading gradient field pulses a plurality of times through the second gradient field coil, to generate a plurality of gradient echo signals distributed across one of the spin echo signals. Thus, each period between the refocus RF pulses includes a plurality of gradient echo signals distributed across one spin echo signal.

The echo signals generated successively are subjected to phase encoding by the phase-encoding gradient field pulse generator generating phase-encoding gradient field pulses through the third gradient field coil immediately before generation of the respective echo signals. The phase encoding is carried out as follows. During each of the periods between the refocus RF pulses, strength of the phase-encoding gradient field pulses is varied for application to each of a plurality of echo signals (hereinafter called the same group of echo signals) generated upon lapse of the same time period from a point of time at which each of the spin echo signals is generated, to vary integrated phase encode amounts of the echo signals from a positive (or negative) value through zero to a negative (or positive) value according to an order of generation of the echo signals.

In this way, the spin echo signals in each group have integrated phase encode amounts successively decreasing (or increasing) in the order of generation. That is, different phase encoding is effected for the data acquired from the echo signals having the same degree of signal attenuation (i.e. in the same group). These data are arranged in a positive direction of the same k space in the order of signal generation (or in the opposite order thereto). The data processor arranges data acquired from the same group of echo signals in one of different k spaces, and reconstructs a plurality of slice images based on the k spaces, respectively. Thus, a plurality of images having different contrasts are simultaneously obtained, with degrees of signal attenuation serving as a parameter.

In the apparatus according to the present invention, it is preferred that the RF emitter is operable to control emission timing of an "n"th refocus RF pulse ("n" being a positive integer) to establish;

$$\{2(n-1)+1\}\tau$$

where emission of the excitation RF pulse is regarded as time origin, and $\tau$ is a point of time at which a first one of the refocus RF pulses is emitted.

Preferably, the phase-encoding gradient field pulse generator is operable to generate a rewind pulse of reversed polarity and having a strength corresponding to a preceding integrated phase encode amount, after a final one of the echo signals is generated within the each period.

The rewind pulse having the same integrated phase encode amount and reversed polarity allows only a new phase encoding to be carried out after eliminating the influence of the phase encoding effected for a preceding pulse period. As a result, the phase encoding becomes continuous in the k space with phase shift checked, to suppress blurring artifacts in a reconstructed image.

Preferably, the reading gradient field pulse generator is operable to effect polarity switching twice to generate the gradient echo signals at points of time $\Delta T1$ and $\Delta T2$ derived from;

$$\omega c \cdot \Delta T1 = -\pi,$$

and $$\omega c \cdot \Delta T1 = +\pi$$

where $\omega c$ is a difference in resonance frequency between water and fat, and generation of the spin echo signal during each period between the refocus RF pulses is regarded as time origin, thereby generating one each gradient echo signal before and after each of the spin echo signals; and the data processor is operable to:
(a) obtain two sets of reconstruct image data through a two-dimensional Fourier transform of a k space formed of data acquired from a group of gradient echo signals generated at the point of time $\Delta T1$ and a k space formed of data acquired from a group of gradient echo signals generated at the point of time $\Delta T2$;
(b) obtain a quotient from a division between the two sets of reconstruct image data;
(c) obtain two phase error corrected image data by substituting the quotient into the two sets of reconstruct image data;
(d) obtain transformed reconstruct image data through a two-dimensional Fourier transform of a k space formed of data acquired from a group of spin echo signals;
(e) obtain two new sets of reconstruct image data by deriving a sum and a difference from the two phase error corrected image data and the reconstruct image data.

The reading gradient field pulse generator effects polarity switching twice to generate the gradient echo signals at points of time $\Delta T1$ and $\Delta T2$ (derived from the above equations), with generation of the spin echo signal during each period between the refocus RF pulses being regarded as time origin. As a result, one each gradient echo signal is generated before and after each of the spin echo signals. The two gradient echo signals generated in this way include phase errors in respective positions of static field non-uniformity.

The data processor obtains two sets of reconstruct image data through a two-dimensional Fourier transform of a k space formed of data acquired from a group of gradient echo signals generated at the point of time $\Delta T1$ and a k space formed of data acquired from a group of gradient echo signals generated at the point of time $\Delta T2$. Next, the data processor obtains a quotient from a division between the two sets of reconstruct image data. This quotient expresses a phase error in each position of static field non-uniformity. Thus, two phase error corrected image data are obtained by substituting the quotient into the above two reconstruct image data. Further, transformed reconstruct image data is obtained through a two-dimensional Fourier transform of a k space formed of data acquired from a group of spin echo signals (including no phase error). Two new sets of reconstruct image data are obtained by deriving a sum and a difference from the two phase error corrected image data and the transformed reconstruct image data. These two new sets of reconstruct image data provide images of water with only fat components removed and of fat with only water components removed.

Preferably, the phase-encoding gradient field pulse generator is operable to generate the phase-encoding gradient field pulses through the third gradient field coil immediately before generation of the echo signals to form a pulse sequence, and to repeat the pulse sequence while varying the integrated phase encode amounts, the phase-encoding gradient field pulses satisfying the following conditions:

(a) that strength of the phase-encoding gradient field pulses is varied to provide a different integrated phase encode amount for each of the echo signals in the same group of echo signals; and
(b) that the phase-encoding gradient field pulses are generated such that the integrated phase encode amounts be approximately zero for an echo signal generated in a short time (echo time), an echo signal generated in an approximately mean echo time, and an echo signal generated in a long echo time, from a point of time at which the excitation RF pulse is emitted, in the same group of echo signals.

By adjusting, as above, the integrated phase encode amounts applied to the respective echo signals, three types of data acquired from the echo signals having greatly differing time periods (echo times) (i.e. the echo signals having long, mean and long echo times, respectively) with respect to the point of time of the excitation RF pulse are arranged in substantially middle positions of a plurality of k spaces. The region around the middle position of each k space is a low frequency region exerting a significant influence on the contrast of the image reconstructed by a two-dimensional Fourier transform of the k space. Thus, the plurality of slice images reconstructed from the data in the respective k spaces are a proton density image corresponding to the echo time, a T2-enhanced image and a heavy T2 enhanced image. These images have different contrasts.

It is further preferred that the echo times the echo signals are 10–50 ms, 70–120 ms and 130–300 ms, respectively.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

FIGS. 2A through 2E are a time chart showing a pulse sequence in the first embodiment;

FIGS. 3A through 3C are a schematic view showing k spaces in the first embodiment;

FIGS. 4A through 4E are a time chart showing a pulse sequence in a second embodiment.

DETAILED DESCRIPTION OF THE PREFERRED EMBODIMENTS

Preferred embodiments of this invention will be described in detail hereinafter with reference to the drawings.

First Embodiment

Figure 1:
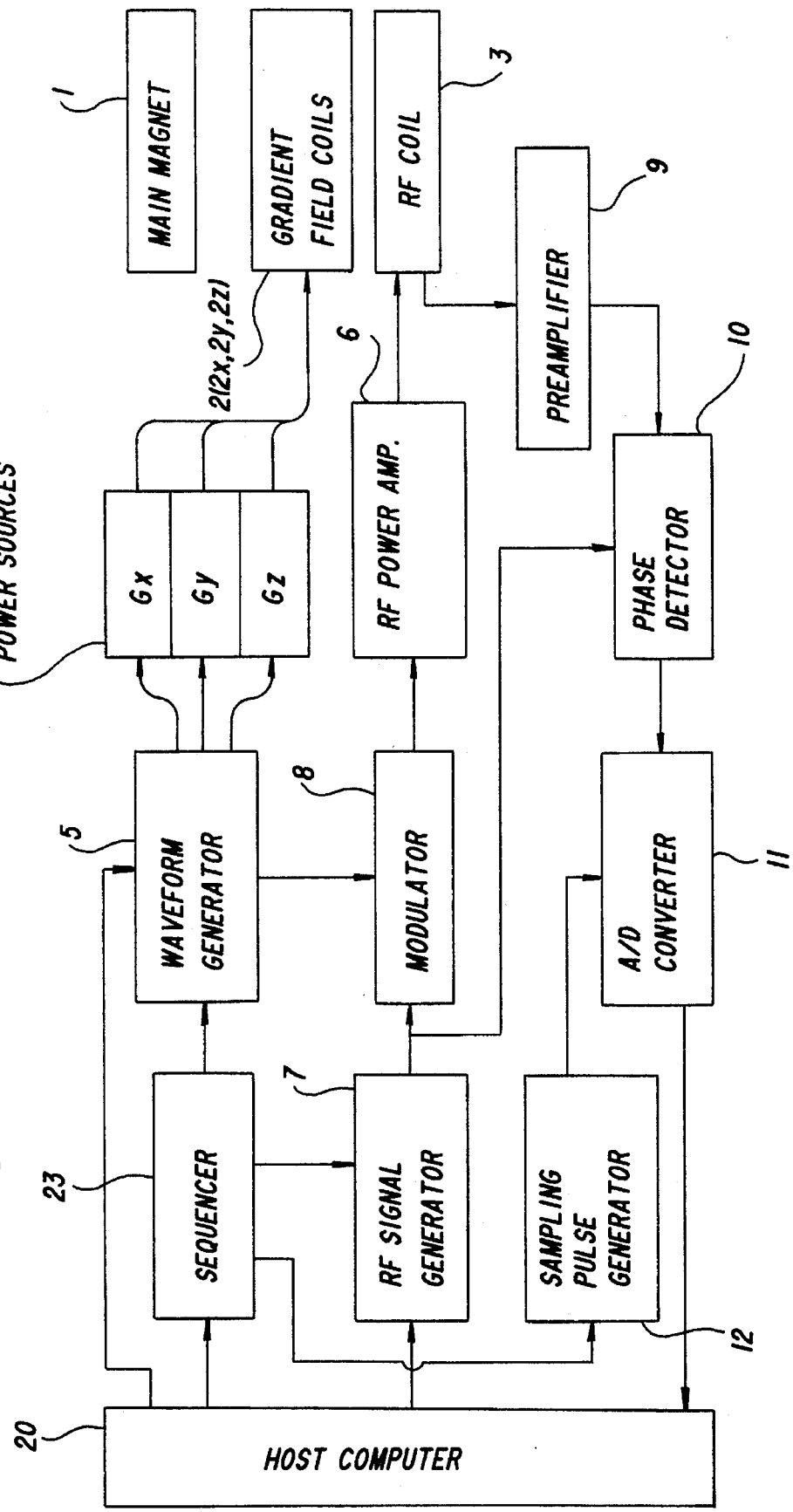
FIG. 1 is a block diagram of an MR imaging apparatus in a first embodiment of this invention.

An MR imaging apparatus in the first embodiment of this invention is constructed as shown in FIG. 1. This MR imaging apparatus includes a main magnet 1 for forming a static magnetic field, and three gradient field coils 2 (i.e. 2x, 2y and 2z) for superimposing gradient magnetic fields on the static magnetic field. The three gradient field coils 2x, 2y and 2z superimpose, on the uniform static field formed by the main magnet 1, pulses for three gradient fields Gs, Gp and Gr (i.e. a slice-selecting gradient field pulse, a phase-encoding gradient field pulse, and a reading gradient field pulse) each having a field strength varying in three orthogonal directions (X, Y and Z). An examinee (patient), not shown, is placed in a space where the static and gradient fields are formed, with a RF coil (radiofrequency coil) 3 attached to the examinee.

Gradient field power sources 4 are connected to the gradient field coils 2 to supply power for generating the gradient fields Gx, Gy and Gz. The gradient field power sources 4 receive waveform signals from a waveform generator 5 to control waveforms of the gradient fields Gx, Gy and Gz. The RF coil 3 receives a RF signal from a RF power amplifier 6 to irradiate the examinee with the RF signal. This RF signal results from an amplitude modulation effected by a modulator 8, according to a waveform received from the waveform generator 5, on a RF signal of a predetermined carrier frequency generated by a RF signal generator 7.

The RF coil 3 receives NMR signals generated in the examinee, and transmits these signals through a preamplifier 9 to a phase detector 10. The phase detector 10 detects phases of the signals received, using the RF signal from the RF signal generator 7 as a reference frequency. Results of the detection are outputted to an analog-to-digital (A/D) converter 11. The A/D converter 11 also receives sampling pulses from a sampling pulse generator 12 for use in converting the detection results into digital data. The digital data are given to a host computer 20.

The host computer 20 processes the data to reconstruct images, and determines timing of an overall sequence through a sequencer 23. That is, the sequencer 23, under the control of the host computer 20, transmits timing signals to the waveform generator 5, RF signal generator 7 and sampling pulse generator 12 to determine timing of waveform signal output from the waveform generator 5, timing of RF signal generation by the RF signal generator 7, and timing of sampling pulse generation by the sampling pulse generator 12. Further, the host computer 20 transmits waveform information to the waveform generator 5 to control the waveform, strength and the like of the pulses for the gradient fields Gx, Gy and Gz, and to determine an envelope of the RF signal emitted from the RF coil 3 to the examinee. The host computer 20 also transmits a signal to the RF signal generator 7 to control the carrier frequency of the RF signal. Thus, the host computer 20 controls the overall pulse sequence based on the GRASE technique.

The above MR imaging apparatus, under control of the host computer 20 and sequencer 23, executes a pulse sequence as shown in FIGS. 2A–2E. The pulse sequence shown in FIGS. 2A–2E is based essentially on the GRASE technique with a partial improvement.

First, one 90° pulse (excitation RF pulse) 100 is applied through the RF coil 3, and simultaneously a pulse 110 is applied through the gradient field coil 2x to form a slice-selecting gradient field Gs. Then, a 180° pulse (refocus RF pulse) 101 is applied upon lapse of time τ from application of the 90° pulse 100, and a 180° pulse (refocus RF pulse) 102 upon lapse of time 2τ from the 180° pulse 101. In this way, 180° pulses 101, 102 and 103 are applied successively along with slice-selecting gradient field pulses 111, 112 and 113 (see FIGS. 2A and 2B).

In this case, as shown in FIG. 2E, a first spin echo signal S2 is generated around a point of time delayed from the 180° pulse 101 by a period of time corresponding to the period of time τ between the 90° pulse 100 and 180° pulse 101. Here, the time taken from the 90° pulse 100 to the echo center of spin echo signal S2 (echo time 2τ) is regarded as time t1.

Assuming that the echo delay time from the 90° pulse 100 to the echo center is t1 as noted above, the first 180° pulse 101 is set to t=(½)t1=τ, where the 90° pulse 100 is regarded as time origin (t=0). Thus, emission time of an "n"th 180° pulse ("n" being a positive integer) is set to $\{2(n-1)+1\}\tau$. That is, by setting emission times of 180° pulses 101, 102 and 103 to t=τ, t=(3/2)t1=3τ, and t=(5/2)t1=5τ, respectively, spin echo signals S2, S5 and S8 are generated at points of time t1, t2 and t3, respectively. Thus, the periods of time t2 and t3 from the 90° pulse 100 to generation of the second and subsequent spin echo signals S5 and S8 correspond to the period of time t1 from the 90° pulse 100 to generation of the first spin echo signal multiplied by integers, i.e. t2=2t1 and t3=3t1.

By controlling emission timing of the 180° pulses as above, spurious spin echo signals due to imperfection of the 180° pulses are generated at the same points of time as the primary spin echo signals to suppress phase shift. In this way, the spurious spin echo signals may also be used as stimulated spin echo signals for image formation.

Next, as shown in FIG. 2C, a dephasing gradient pulse 120 (for disarraying the spin phase of protons) is applied through the gradient field coil 2z before the first 180° pulse 101. Subsequently, during the period between 180° pulses 101 and 102, the polarity of the pulses for forming gradient fields Gr is switched twice, from positive to negative and from negative to positive (121a to 121b and 121b to 121c), for example, to generate echo signals S1–S3 during this period. Similarly, the polarity of Gr pulses is switched during the period between the second 180° pulse 102 and third 180° pulse 103 and after the third 180° pulse 103, each to generate three echo signals S4–S6 or S7–S9. The middle echo signals S2, S5 and S8 among these echo signals S1–S9 are spin echo signals free from phase errors due to non-uniformity of the static magnetic field formed by the main magnet 1, due to an iron deposit such as a hematoma, or due to chemical shift. Further, these spin echo signals S2, S5 and S8 are attenuated by a relatively minor degree. The other echo signals S1, S3, S4, S6, S7 and S9 generated before and after the above spin echo signals are gradient echo signals attenuated by a relatively large degree under the influence of the above phase errors.

As shown in FIG. 2E, the echo signals S1–S9 have strengths diminishing in the order of generation thereof. The time constants for this attenuation are transverse relaxation times T2 and T2*. Specifically, the spin echo signals S2, S5 and S8 unaffected by the non-uniformity of the static magnetic field attenuate with the transverse relaxation time T2 (also called spin-spin relaxation time since an energy exchange takes place between the spins), while the gradient echo signals S1, S3, S4, S6, S7 and S9 influenced by the non-uniformity of the static magnetic field attenuate with the transverse relaxation time T2* involving a faster attenuation due to the non-uniformity of the static magnetic field than time constant T2.

Then, as shown in FIG. 2D, the phase-encoding gradient field pulses Gp are applied through the gradient field coil 2y to phase-encode the respective echo signals S1–S9.

Gp pulse 201a applied after the first 180° pulse 101 and before generation of the echo signal S1 has the greatest amplitude of positive polarity. Consequently, the data acquired from the echo signal S1 is placed in an uppermost line in the vertical direction (phase-encoding direction) of a k space. No Gp pulses are applied before generation of the next echo signal S2 or subsequent echo signal S3. Thus, each of the echo signals S2 and S3 has an integrated encode amount (i201b or i201c), as shown in a dotted line in FIG. 2D, corresponding to a phase encode amount (integrated amount (i201a)) of the echo signal S1 applied immediately before. That is, the echo signals S2 and S3 are put to the same phase encoding as the echo signal S1. Consequently, the data acquired from the echo signals S2 and S3 are placed in uppermost lines in the vertical direction (phase-encoding direction) of k spaces, as is the data from the echo signal S1. Then, Gp pulse 201d of reversed polarity is applied before the next 180° pulse 102. This Gp pulse 201d has an amplitude corresponding to the integrated amount (i201c) of the phase-encoding gradient field Gp pulses applied so far. As a result, the phase encoding effected up to this point is initialized to zero. This Gp pulse 201d is called a rewind pulse which eliminates influences of the phase encoding already effected, to assure accuracy of subsequent phase encoding. This suppresses phase shifts to provide continuous phase-encoding data in the k spaces, thereby to avoid blurring artifacts appearing in reconstructed images.

Gp pulse 202a applied after the second 180° pulse 102 and before generation of the echo signal S4 has a small absolute value close to zero. Consequently, the data acquired from the echo signal S4 is placed in a line adjacent a vertically middle position of the first k space. No Gp pulses are applied before generation of the next echo signal S5 or subsequent echo signal S6. Thus, Gp pulse 202a gives the echo signals S4, S5 and S6 the same integrated phase encode amount (i202a, i202b and i202c). The data acquired from the echo signals S4, S5 and S6 are placed in lines adjacent the vertically middle positions of the k spaces. After generation of the echo signal S6, Gp pulse 202d is applied as a rewind pulse.

Gp pulse 203a applied after the third 180° pulse 103 and before generation of the echo signal S7 has negative polarity. Consequently, the data acquired from the echo signal S7 is placed in a line in a vertically lower region of the first k space. No Gp pulses are applied before generation of the next echo signals S8 and S9. Thus, the echo signals S7, S8 and S9 have the same integrated phase encode amount (i203a, i203b and i203c). The data acquired from the echo signals S7, S8 and S9 are placed in lines in the vertically lower regions of the k spaces. After generation of the echo signal S9, a rewind pulse (Gp pulse) 203d is applied.

In this way, the respective echo signals have integrated phase encode amounts as shown in FIG. 2D. Specifically, the echo signals S1, S2 and S3 have the same positive integrated phase encode amount i201a, i201b and i201c. The echo signals S4, S5 and S6 have the same integrated phase encode amount i202a, i202b and i202c which is close to zero. The echo signals S7, S8 and S9 have the same negative integrated phase encode amount i203a, i203b and i203c.

In other words, during the respective periods between the refocus RF pulses, a plurality of echo signals are generated at the same time intervals, with respect to time origins provided by the points of time at which the respective spin echo signals S2, S5 and S8 are generated (which are divided into a group of echo signals S1, S4 and S7, a group of echo signals S2, S5 and S8 and a group of echo signals S3, S6 and S9). The phase-encoding gradient field Gp pulses have different strengths so that the integrated phase encode amounts vary, in the order of generation of the echo signals, from positive to negative through zero (in the directions shown in two-dot-and-dash lines and referenced "a", "b" and "c" in FIG. 2D).

For a next repetition period of the above pulse sequence, the phase-encoding gradient field Gp pulses 201a, 202a and 203a are slightly varied (specifically, reduced) for application of phase encoding to the respective echo signals. Consequently, the data acquired from echo signals S1, S2 and S3 generated in the next pulse sequence are placed in lines in upper regions of the k spaces (specifically, in lines immediately below the lines of data acquired from the echo signals S1, S2 and S3 in the preceding pulse sequence). The data acquired from the echo signals S4, S5 and S6 are placed in lines adjacent the middle position. The data acquired from echo signals S7, S8 and S9 are placed in lines in the lower regions. The rewind pulses 201*d*, 202*d* and 203*d* have varied amplitudes in corresponding relationships with the varied amplitudes of the phase-encoding gradient field Gp pulses.

The above pulse sequence is repeated a predetermined number of times to acquire groups of data from the echo signals S1–S9. The group of data acquired from the echo signals S1–S3, the group of data acquired from the echo signals S4–S6 and the group of data acquired from the echo signals S7–S9 receive the same phase encoding, respectively. The host computer 20 arranges, in a different k space, the data acquired from each group of echo signals (i.e. the group of echo signals S1, S4 and S7, the group of echo signals S2, S5 and S8 and the group of echo signals S3, S6 and S9) according to the integrated phase encode amounts applied thereto.

Specifically, the group of data acquired from the echo signals S1, S4 and S7 are arranged in the k space shown in FIG. 3A, in lines L1, L5 and L9 according to the integrated phase encode amounts. Similarly, the group of data acquired from the echo signals S2, S5 and S8 are arranged in lines L1, L5 and L9 of the k space shown in FIG. 3B. The group of data acquired from the echo signals S3, S6 and S9 are arranged in lines L1, L5 and L9 of the k space shown in FIG. 3C. The groups of data acquired from a series of pulse sequence repeated a predetermined number of times are successively arranged in lines L2, L6 and L10 et seq. of the k spaces according to the integrated phase encode amounts, respectively.

Where, for example, the above pulse sequence is repeated four times, the data thereby collected are arranged in 12 lines of each of the three k spaces shown in FIGS. 3A, 3B and 3C. In this case, one k space (FIG. 3A) is filled with the groups of data acquired from the (gradient) echo signals S1, S4 and S7 generated (before the respective spin echo signals S2, S5 and S8) at the same interval of time from the spin echo signals S2, S5 and S8. Similarly, one k space (FIG. 3B) is filled with the groups of data acquired from the (spin) echo signals S2, S5 and S7. One k space (FIG. 3C) is filled with the groups of data acquired from the (gradient) echo signals S3, S6 and S9 (generated after the respective spin echo signals). The spin echo signals S2, S5 and S8 include no phase error due to non-uniformity of the static magnetic field and the like. The gradient echo signals S1, S4 and S7 generated before the spin echo signals include the same phase error as each other, and the gradient echo signals S3, S6 and S9 generated after the spin echo signals also include the same phase error as each other (which is different from that of gradient echo signals S1, S4 and S7). However, since the groups of data based on the echo signals having the same phase error are arranged in the same k space, a phase error due to non-uniformity of the static magnetic field or due to chemical shift is avoided at boundaries between the respective signals in the k space (at the boundaries between regions I, II and III where the echo signals S1, S4 and S7 are arranged, respectively, in the k space shown in FIG. 3A, for example). Consequently, no image blurring due to the above phase error appears in the three images reconstructed by a two-dimensional Fourier transform of the data arranged in the three k spaces.

In addition, the three reconstructed images reflect different degrees of signal attenuation since they are based on the spin echo signals (which attenuate with time constant T2) and on the gradient echo signals generated at the points of time apart (backward and forward) from spin echo conditions (to attenuate with time constant T2*). Where a tumor due to an iron deposit such as a hematoma is present in the examinee's body, considerable variations in magnetization rate occur with the gradient echo signals. As a result, signal strength diminishes sharply at points of time apart from the points of time where spin echo conditions are established (at points of time t1, t2 and t3 in FIG. 2E). It helps toward diagnosis of tumors as noted above to procure a plurality of images providing, as a parameter, such a signal attenuation resulting from the non-uniformity of the magnetic field due to a difference in magnetization rate.

Further, in the pulse sequence of FIGS. 2A–2E, time periods between the spin echo signal S2, S5 or S8 and the gradient echo signals S1, S4 or S7 and S3, S6 or S9 generated before and after the spin echo signal within each period between the 180° pulses are set to $\Delta T1$ and $\Delta T2$ as shown in FIGS. 2C and 2E. These time periods $\Delta T1$ and $\Delta T2$ satisfy the following equations:

$$\omega c \cdot \Delta T1 = -\pi \text{ (for echo signals S1, S4 and S7),}$$

and $$\omega c \cdot \Delta T2 = +\pi \text{ (for echo signals S3, S6 and S9).}$$

In the above equations, $\omega c$ is a difference in resonance frequency between water and fat. That is, time periods $\Delta T1$ and $\Delta T2$ are provided by adjusting emission timing of the reading gradient field Gr pulses to switch polarity twice (from positive to negative and from negative to positive).

By effecting a series of pulse sequences in this way to obtain the data rows in the three k spaces as shown in FIGS. 3A, 3B and 3C, water/fat separation images are realized (with fat and water components excluded). Specifically, two sets of reconstruct image data are first obtained by a two-dimensional Fourier transform of the data rows in the k spaces of FIGS. 3A and 3C including different phase errors (based on the gradient echo signals generated before and after the spin echo signals). Then, a quotient is derived from a division between the two sets of reconstruct image data (expressed in complex numbers). This quotient represents a phase error in each position due to non-uniformity of the magnetic field. Thus, two sets of image data with the above phase errors corrected (phase error corrected image data) are obtained by substituting this quotient into the two sets of reconstruct image data. Two new sets of reconstruct image data are obtained by deriving a sum and a difference from the above two phase error corrected image data and transformed reconstruct image data derived from a two-dimensional Fourier transform of the data rows of FIG. 3B (based on the spin echo signals including no phase error). These two new sets of reconstruct image data provide images of water with only the fat components removed therefrom and of fat with only the water components removed therefrom. The data processing for obtaining such images of water without the fat components and of fat without the water components is already described in detail in a publication (Y. S. Kim, et al "Chemical-Shift Imaging with Large Magnetic Field Inhomogeneity", Magnetic Resonance in Medicine 4,452–460, 1987), and will not particularly be discussed herein.

In the first embodiment described hereinbefore, the phase-encoding gradient field Gp pulse 201*a* has positive polarity, and Gp pulse 203*a* negative polarity, with progressively diminishing amplitudes. However, Gp pulse 201*a* may have negative polarity, and Gp pulse 203*a* positive polarity, with progressively diminishing amplitudes. Then, the data arrangements in the k spaces are vertically reversed from what are illustrated in FIGS. 3A–3C.

Second Embodiment

A second embodiment will be described next. The construction of the MR imaging apparatus remains the same as in the first embodiment, and will not be described again. FIGS. 4A–4C (showing application timing of the 90° and 180° pulses, slice selecting gradient field Gs pulses, and reading gradient field Gr pulses) are precisely the same as the corresponding figures for the first embodiment, and will not be described again.

In this embodiment, as shown in FIG. 4D, phase-encoding gradient field pulses Gp are applied through the gradient field coil 2y to phase-encode the respective echo signals S1–S9.

Gp pulse 301a applied before generation of echo signal S1 has an amplitude approximately zero. Consequently, the data acquired from the echo signal S1 is placed in a line adjacent a middle position in a phase-encoding direction of a first k space. Gp pulse 301b applied before generation of the next echo signal S2 has positive polarity and a greater amplitude than Gp pulse 301a. Integrated with Gp pulse 301a already applied (=(i301a): reference "i" added before a Gp pulse denotes an integrated amount of the Gp pulse), the phase encoding applied to the echo signal S2 has a large, positive integrated amount (i301b). The data acquired from the echo signal S2 is placed in an uppermost line in the phase-encoding direction of a second k space. Gp pulse 301c applied before generation of the next echo signal S3 has negative polarity and has a larger absolute value than Gp pulse 301b. Integrated with the immediately preceding, large positive integrated amount (i301b), the phase encoding applied to the echo signal S3 has a small, negative integrated amount (i301c). The data acquired from the echo signal S3 is placed in a line in a lower region of a third k space. Then, as in the first embodiment, a rewind pulse 301d of is applied which has reversed polarity and an amplitude corresponding to the immediately preceding, small negative integrated amount (i301c).

Next, Gp pulse 302a applied before generation of the echo signal S4 has the same amplitude as Gp pulse 301a and reversed (negative) polarity. The data acquired from the echo signal S4 is placed in a line in a lower region of the first k space. Gp pulse 302b applied before generation of the next echo signal S5 has the same amplitude as Gp pulse 301b. Integrated with Gp pulse 302a already applied (=(i302a)), the phase encoding applied to the echo signal S5 has an integrated amount (i301b) approximately zero. The data based on the echo signal S5 is placed in a line adjacent a middle position of the second k space. Gp pulse 302c applied before generation of the next echo signal S6 has the same amplitude as the immediately preceding Gp pulse 302b. Integrated with the immediately preceding integrated amount close to zero (i302b), the phase encoding applied to the echo signal S6 has a large positive integrated amount (i302c). The data based on the echo signal S6 is placed in the uppermost line of the third k space. Then, similarly, a rewind pulse 302d is applied.

Next, Gp pulse 303a applied before generation of the echo signal S7 has positive polarity and the greatest amplitude. The data based on the echo signal S7 is placed in the uppermost line of the first k space. Gp pulse 303b applied before generation of the next echo signal S8 has the same amplitude as Gp pulse 301c. Integrated with Gp pulse 303a already applied (=(i303a)), the phase encoding applied to the echo signal S8 has a small negative integrated amount (i303b). The data based on the echo signal S8 is placed in a line in a lower region of the second k space. Gp pulse 303c applied before generation of the next echo signal S9 has the same amplitude as Gp pulse 302b. Integrated with the immediately preceding, small negative integrated amount (i303b), the phase encoding applied to the echo signal S9 has an integrated amount (i303c) approximately zero. The data based on the echo signal S9 is placed in a line adjacent a middle position of the third k space. Then, similarly, a rewind pulse 303d is applied.

Figure 5C:
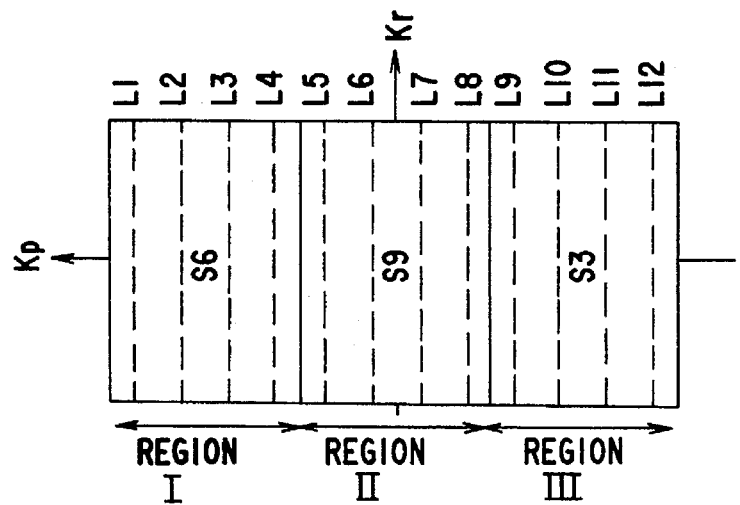
FIGS. 5A through 5C are a schematic view showing k spaces in the second embodiment.
Figure 5B:
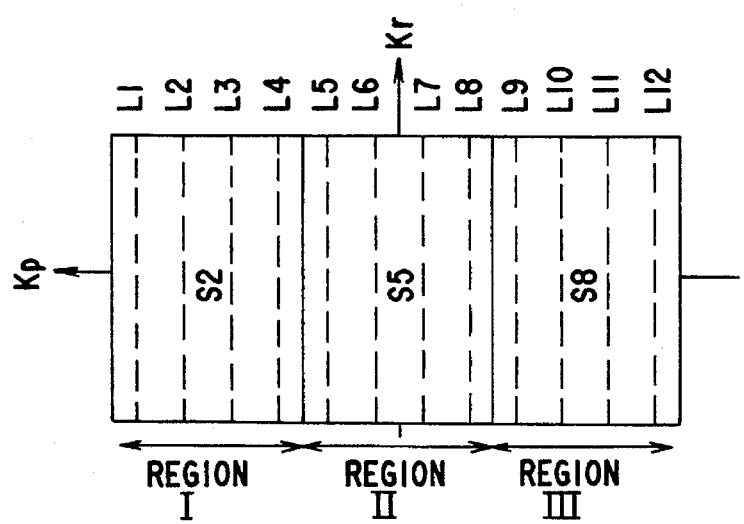
Figure 5A:
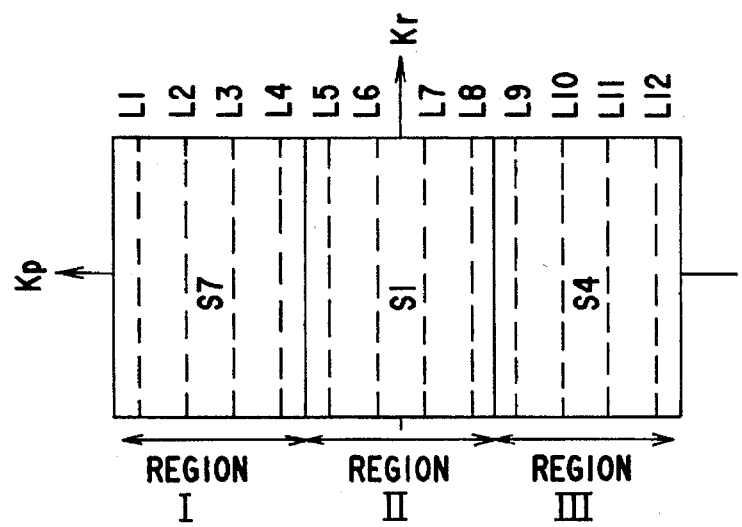

In the above pulse sequence, as in the pulse sequence of the first embodiment shown in FIGS. 2A–2E, one k space is filled with the (gradient) echo signals S1, S4 and S7 generated (before the respective spin echo signals S2, S5 and S8) at the same time period from the spin echo signals S2, S5 and S8, one k space is filled with the (spin) echo signals S2, S5 and S7, and one k space is filled with the (gradient) echo signals S3, S6 and S9 (generated after the respective spin echo signals) (see FIGS. 5A, 5B and 5C). This embodiment differs from the first embodiment in that phase encoding is effected to place the (gradient) echo signal S1 adjacent the middle position of the k space shown in FIG. 5A, the (spin) echo signal S5 adjacent the middle position of the k space shown in FIG. 5B, and the (gradient) echo signal S9 adjacent the middle position of the k space shown in FIG. 5C.

Thus, as noted above, the echo signal S1 is placed adjacent the middle position of the k space shown in FIG. 5A, the echo signal S5 adjacent the middle position of the k space shown in FIG. 5B, and the echo signal S9 adjacent the middle position of the k space shown in FIG. 5C. When an image is reconstructed by a two-dimensional Fourier transform of a k space, the contrast of the reconstructed image is dependent upon the data arranged adjacent the middle position (which is a low frequency range corresponding to region II in the drawings) of the k space. Thus, the contrast of the image derived from FIG. 5A is dependent upon the (gradient) echo signal S1. The contrast of the image derived from FIG. 5B is dependent upon the (spin) echo signal S5. The contrast of the image derived from FIG. 5C is dependent upon the (gradient) echo signal S9.

Further, as shown in FIG. 4E, the (gradient) echo signal S1 placed in region II adjacent the middle position of one k space has a short echo time $t_{E1}$. The (gradient) echo signal S9 placed in region II of another k space has a very long echo time $t_{E3}$. The (spin) echo signal S5 placed in region II of one k space has an echo time $t_{E2}$ of intermediate length. When, for example, this pulse sequence has a repetition time set to about 3000 ms or longer, each period of time between the 180° pulses may be set to 40 ms (=2τ), and periods of time between the echo signals S1, S2 and S3, between the echo signals S4, S5 and S6 and between the echo signals S7, S8 and S9 to ΔT1 and ΔT2, respectively, as shown in FIG. 4E, with ΔT1 and ΔT2 being 10 ms each. Then, the echo time $t_{E1}$ of the echo signal S1 is 30 ms, the echo time $t_{E2}$ of the echo signal S5 is 80 ms, and the echo time $t_{E3}$ of the echo signal S9 is 130 ms. The images obtained by a two-dimensional Fourier transform of the k spaces shown in FIGS. 5A–5C are a proton density image (not including T2 relaxation information), a T2-enhanced image (with water components enhanced to be whitish) and a heavy T2-enhanced image (with highly enhanced water components). Thus, multi-contrast images may be obtained at high speed through one imaging sequence.

The above echo times $t_{E1}$, $t_{E2}$ and $t_{E3}$ may be in the ranges of 10–50 ms, 70–120 ms and 130–300 ms, respectively. These ranges will realize a plurality of contrasts similar to the above.

In the pulse sequence in each of the first and second embodiments described hereinbefore, nine echo signals in total are obtained by applying three refocus RF pulses after one excitation RF pulse. The number of refocus RF pulses may be increased by one to generate a total of 12 echo signals, or by two to generate a total of 15 echo signals. Further, the reading gradient field Gr pulses may be switched four or six times, instead of twice, during each period between the refocus RF pulses. Then, five or seven echo signals (with only the middle one being a spin echo signal, and the rest gradient echo signals) may be obtained during each period between the refocus RF pulses.

The present invention may be embodied in other specific forms without departing from the spirit or essential attributes thereof and, accordingly, reference should be made to the appended claims, rather than to the foregoing specification, as indicating the scope of the invention.

What is claimed is:

1. An MR imaging method using NMR phenomenon, comprising the steps of:

(a) emitting an excitation RF pulse and thereafter a plurality of refocus RF pulses to an object to generate a plurality of spin echo signals successively;

(b) applying slice selecting gradient field pulses simultaneously with said excitation RF pulse and said refocus RF pulses, respectively, for selecting slice planes;

(c) switching polarity of reading gradient field pulses a plurality of times, during periods between said refocus RF pulses, to generate a plurality of gradient echo signals distributed across one of said spin echo signals, and applying said reading gradient field pulses in timed relationship with generation of said spin echo signals;

(d) varying, during said periods between said refocus RF pulses, a strength of said phase-encoding gradient field pulses for application to each of a plurality of echo signals (hereinafter called the same group of echo signals) generated upon lapse of a same time period from a point of time at which each of said spin echo signals is generated, to vary integrated phase encode amounts of said echo signals from a positive (or negative) value through 0 to a negative (or positive) value according to an order of generation of said echo signals;

(e) repeating a pulse sequence of steps (a) through (d) above while varying said integrated phase encode amount at step (d) above; and (f) acquiring data from the same group of echo signals and processing said data to be arranged in one of different k spaces according to said integrated phase encode amount applied to each of said echo signals, to reconstruct a plurality of slice images based on said k spaces, respectively.

2. A method as defined in claim 1, wherein, at step (a) above, emission timing of an "n"th refocus RF pulse ("n" being a positive integer) is set to establish;

$$\{2(n-1)+1\}\tau$$

where emission of said excitation RF pulse is regarded as time origin, and $\tau$ is a point of time at which a first one of said refocus RF pulses is emitted.

3. An MR imaging apparatus using NMR phenomenon, comprising:

a main magnet for generating a uniform static magnetic field in an imaging space;

a first, a second and a third gradient field coils attached to said main magnet for generating three types of gradient field pulses (i.e. slice-selecting gradient field pulses, reading gradient field pulses and phase-encoding gradient field pulses) with magnetic strengths varying in three orthogonal directions in said imaging space;

a RF coil for emitting an excitation RF pulse and a plurality of refocus RF pulses to an object placed in said imaging space, and detecting echo signals generated from said object;

RF emitting means for successively emitting said excitation RF pulse and said refocus RF pulses with predetermined timing through said RF coil;

slice-selecting gradient field pulse generating means for generating said slice-selecting gradient field pulses through said first gradient field coil for selecting slice planes, in timed relationship with said excitation RF pulse and said refocus RF pulses;

reading gradient field pulse generating means for switching polarity a plurality of times to generate a plurality of gradient echo signals distributed across spin echo signals, and generating said reading gradient field pulses through said second gradient field coil in timed relationship with said spin echo signals and said gradient echo signals, during each of periods between said refocus RF pulses;

phase-encoding gradient field pulse generating means for varying, during each of said periods between said refocus RF pulses, strength of said phase-encoding gradient field pulses for application to each of a plurality of echo signals (hereinafter called the same group of echo signals) generated upon lapse of a same time period from a point of time at which each of said spin echo signals is generated, to vary integrated phase encode amounts of said echo signals from a positive (or negative) value through zero to a negative (or positive) value according to an order of generation of said echo signals, for generating said phase-encoding gradient field pulses through said third gradient field coil immediately before generation of said echo signals to form a pulse sequence, and for repeating said pulse sequence while varying said integrated phase encode amounts; and data processing means for acquiring and arranging data from a same group of echo signals in one of different k spaces according to said integrated phase encode amount applied to each of said echo signals, and for reconstructing a plurality of slice images based on said k spaces, respectively.

4. An apparatus as defined in claim 3, wherein said RF emitting means is operable to control emission timing of an "n"th refocus RF pulse ("n" being a positive integer) to establish;

$$\{2(n-1)+1\}\tau$$

where emission of said excitation RF pulse is regarded as time origin, and $\tau$ is a point of time at which a first one of said refocus RF pulses is emitted.

5. An apparatus as defined in claim 3, wherein said phase-encoding gradient field pulse generating means is operable to generate a rewind pulse of reversed polarity, said rewind pulse having a strength corresponding to a preceding integrated phase encode amount, after a final one of said echo signals is generated within said each period.

6. An apparatus as defined in claim 3, wherein said reading gradient field pulse generating means is operable to effect polarity switching twice to generate said gradient echo signals at points of time $\Delta T1$ and $\Delta T2$ derived from;

$$\omega c \cdot \Delta T1 = -\pi,$$

and $$\omega c \cdot \Delta T2 = +\pi$$

where $\omega c$ is a difference in resonance frequency between water and fat, and generation of a spin echo signal during each period between said refocus RF pulses is regarded as time origin, thereby generating one gradient echo signal before and after each of said spin echo signals; and said data processing means is operable to:
- (a) obtain two reconstruct image data through a two-dimensional Fourier transform of a k space formed of data acquired from a group of gradient echo signals generated at the point of time $\Delta T1$ and a k space formed of data acquired from a group of gradient echo signals generated at the point of time $\Delta T2$;
- (b) obtain a quotient from a division between said two reconstruct image data;
- (c) obtain two phase error corrected image data by substituting said quotient into said two reconstruct image data;
- (d) obtain reconstruct image data through a two-dimensional Fourier transform of a k space formed of data acquired from a group of spin echo signals;
- (e) obtain two new reconstruct image data by deriving a sum and a difference from said two phase error corrected image data and said reconstruct image data.

7. An apparatus as defined in claim 3, wherein said phase-encoding gradient field pulse generating means is operable to generate said phase-encoding gradient field pulses through said third gradient field coil immediately before generation of said echo signals to form a pulse sequence, and to repeat said pulse sequence while varying said integrated phase encode amounts, said phase-encoding gradient field pulses satisfying the following conditions:
- (a) that strength of said phase-encoding gradient field pulses is varied to provide a different integrated phase encode amount for each of said echo signals in the same group of echo signals; and
- (b) that said phase-encoding gradient field pulses are generated such that the integrated phase encode amounts be approximately zero for an echo signal generated in a short time (echo time), an echo signal generated in an approximately mean echo time, and an echo signal generated in a long echo time, from a point of time at which said excitation RF pulse is emitted, in the same group of echo signals.

8. An apparatus as defined in claim 7, wherein said short echo time echo signals are 10–50 ms, said mean echo time echo signals are 70–120 ms, and said long echo time echo signals are 130–300 ms, respectively.

* * * * *